United States Patent
Bagung et al.

(10) Patent No.: US 12,046,531 B2
(45) Date of Patent: Jul. 23, 2024

(54) SEMICONDUCTOR COMPONENT ARRANGEMENT, METHOD FOR FABRICATION THEREOF AND HEAT DISSIPATION DEVICE

(71) Applicant: Vitesco Technologies GmbH, Hannover (DE)

(72) Inventors: Detlev Bagung, Munich (DE); Christina Quest-Matt, Munich (DE); Thomas Riepl, Munich (DE); Daniela Wolf, Munich (DE)

(73) Assignee: Vitesco Technologies GmbH, Regensburg (DE)

(*) Notice: Subject to any disclaimer, the term of this patent is extended or adjusted under 35 U.S.C. 154(b) by 589 days.

(21) Appl. No.: 17/285,295

(22) PCT Filed: Oct. 8, 2019

(86) PCT No.: PCT/EP2019/077255
§ 371 (c)(1),
(2) Date: Apr. 14, 2021

(87) PCT Pub. No.: WO2020/078778
PCT Pub. Date: Apr. 23, 2020

(65) Prior Publication Data
US 2022/0115290 A1   Apr. 14, 2022

(30) Foreign Application Priority Data
Oct. 15, 2018   (DE) .................. 10 2018 217 607.8

(51) Int. Cl.
*H01L 23/00*   (2006.01)
*H01L 23/373*   (2006.01)
(Continued)

(52) U.S. Cl.
CPC .... *H01L 23/3735* (2013.01); *H01L 23/49838* (2013.01); *H05K 3/341* (2013.01);
(Continued)

(58) Field of Classification Search
CPC ........... H01L 23/3735; H01L 23/49838; H01L 23/49562
See application file for complete search history.

(56) References Cited

U.S. PATENT DOCUMENTS 5,019,941 A   5/1991   Craft
5,050,038 A   9/1991   Malaurie et al.
(Continued)

FOREIGN PATENT DOCUMENTS

CN   104115567 A   10/2014
DE   4332752 A1   3/1995
(Continued)

OTHER PUBLICATIONS

Power MOSFET, Wikipedia, 7 pages, 1959.
(Continued)

*Primary Examiner* — Reema Patel
(74) *Attorney, Agent, or Firm* — Buchanan Ingersoll & Rooney PC

(57) ABSTRACT

A semiconductor component having at least one semiconductor component having a first electrical connector and at least one further electrical connector, a printed circuit board, and a prefabricated metal block group. The metal block group has a first metal block arranged between the semiconductor component and the printed circuit board, connected to a first electrical connector of the semiconductor component by a solder joint and connected to at least one conductor track of the printed circuit board by a further solder joint. The metal block group includes at least one further metal block interposed between the further electrical (Continued)

connection and the printed circuit board by a solder joint. The metal blocks of the prefabricated metal block group are arranged laterally next to one another and have their lateral outer surfaces partially or completely encased by an electrically insulating casing common to them.

12 Claims, 5 Drawing Sheets

(51) Int. Cl.
*H01L 23/498* (2006.01)
*H05K 3/34* (2006.01)
*H01L 23/495* (2006.01)
*H05K 1/18* (2006.01)

(52) U.S. Cl.
CPC ........ *H01L 23/49562* (2013.01); *H05K 1/181* (2013.01); *H05K 2201/10166* (2013.01); *H05K 2201/10378* (2013.01)

(56) References Cited

U.S. PATENT DOCUMENTS

| | | |
|---|---|---|
| 5,727,727 A | 3/1998 | Ead |
| 5,792,677 A | 8/1998 | Reddy et al. |
| 6,200,407 B1 | 3/2001 | Wieloch et al. |
| 6,222,732 B1 | 4/2001 | Jakob et al. |
| 6,226,183 B1 | 5/2001 | Weber et al. |
| 10,154,590 B2 | 12/2018 | Chin et al. |
| 2004/0212074 A1 | 10/2004 | Divakar et al. |
| 2005/0263318 A1 | 12/2005 | Yoshioka |
| 2011/0089529 A1 | 4/2011 | Fowlkes et al. |
| 2011/0140272 A1 | 6/2011 | Zhao et al. |
| 2014/0347821 A1 | 11/2014 | Bendani et al. |
| 2015/0022977 A1 | 1/2015 | Kuromitsu et al. |
| 2017/0354037 A1 | 12/2017 | Chin et al. |

FOREIGN PATENT DOCUMENTS

| | | | |
|---|---|---|---|
| DE | 29623190 U1 | 12/1997 | |
| DE | 102012204133 A1 | 9/2013 | |
| DE | 112015005760 T5 | 10/2017 | |
| EP | 0907307 A1 | 4/1999 | |
| WO | WO-2006099936 A2 * | 9/2006 | ............ H01L 23/34 |
| WO | 2013135791 A1 | 9/2013 | |

OTHER PUBLICATIONS

Gulino, R., "Guidelines for Using ST's MOSFET SMD Packages," Jun. 2003, 22 pages, AN1703 Application Note.
International Standard, Basic Safety Publication, IEC 60664-1, Edition 2.0, Apr. 2007, 151 pages, International Electrotechnical Commission (IEC).
Consolidated Version, Basic EMC Publication, IEC 61000-4-6, Edition 3.1, Aug. 2017, 337 pages, International Electrotechnical Commission (IEC).
International Search Report and Written Opinion for International Application No. PCT/EP2019/077255, mailed Jan. 21, 2020, with partial English translation, 8 pages.
International Search Report and Written Opinion for International Application No. PCT/EP2019/077255, mailed Jan. 21, 2020, 13 pages (German).
German Examination Report for German Application No. 10 2018 217 607.8, dated May 3, 2019, 6 pages.
Office Action (The First Office Action) issued Jan. 4, 2024, by the National Intellectual Property Administration, P.R. China in corresponding Chinese Patent Application No. 201980068203.5 and an English translation of the Office Action. (15 pages).

* cited by examiner

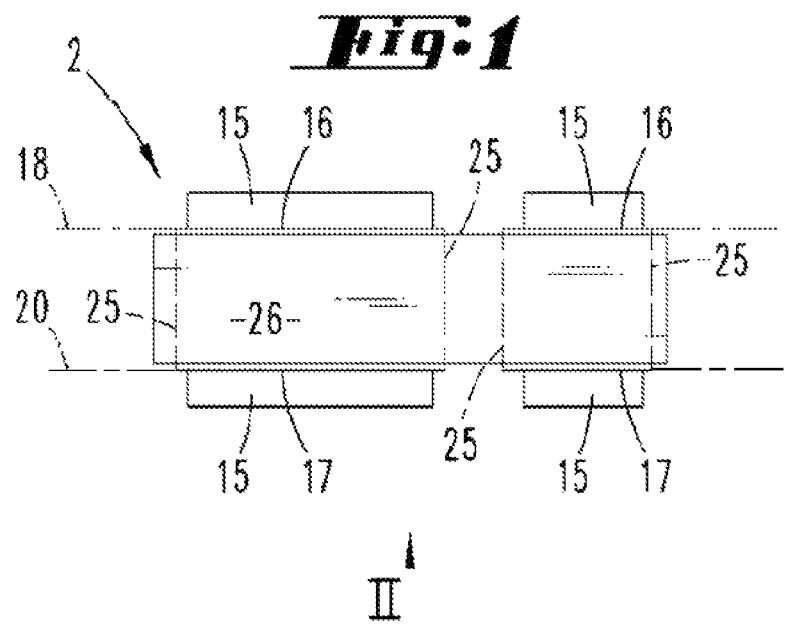
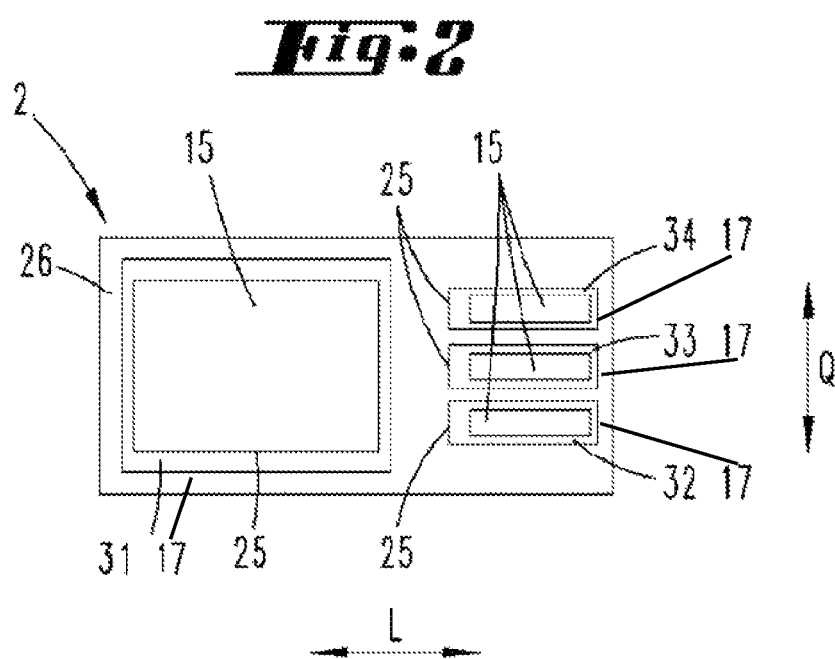

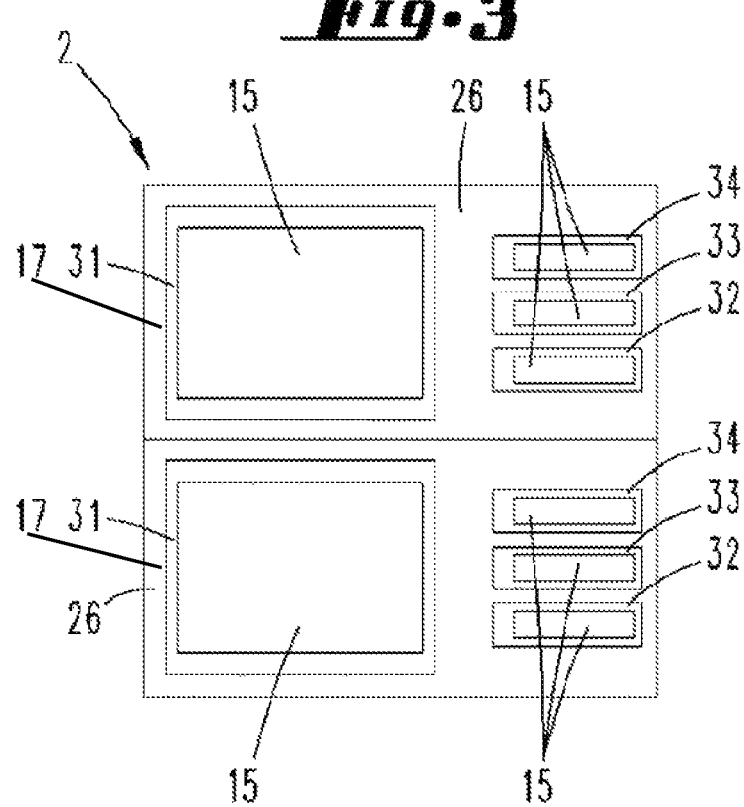

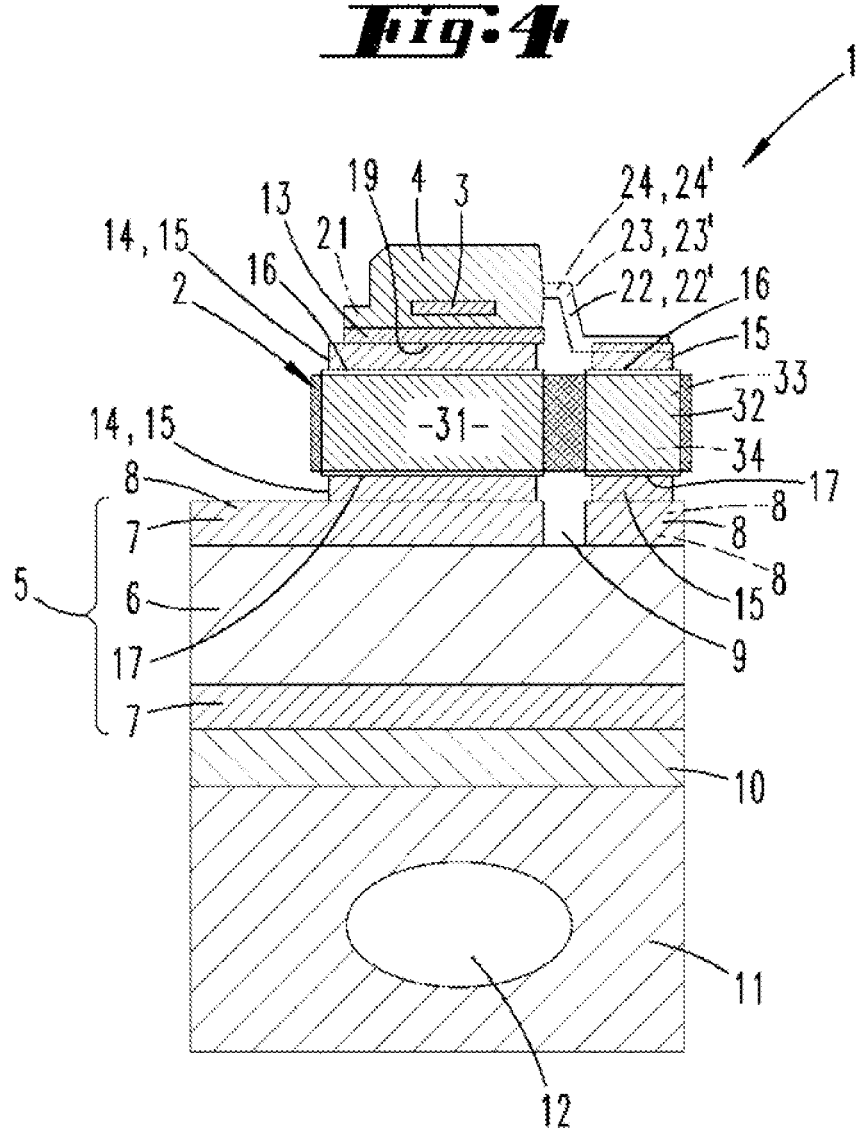

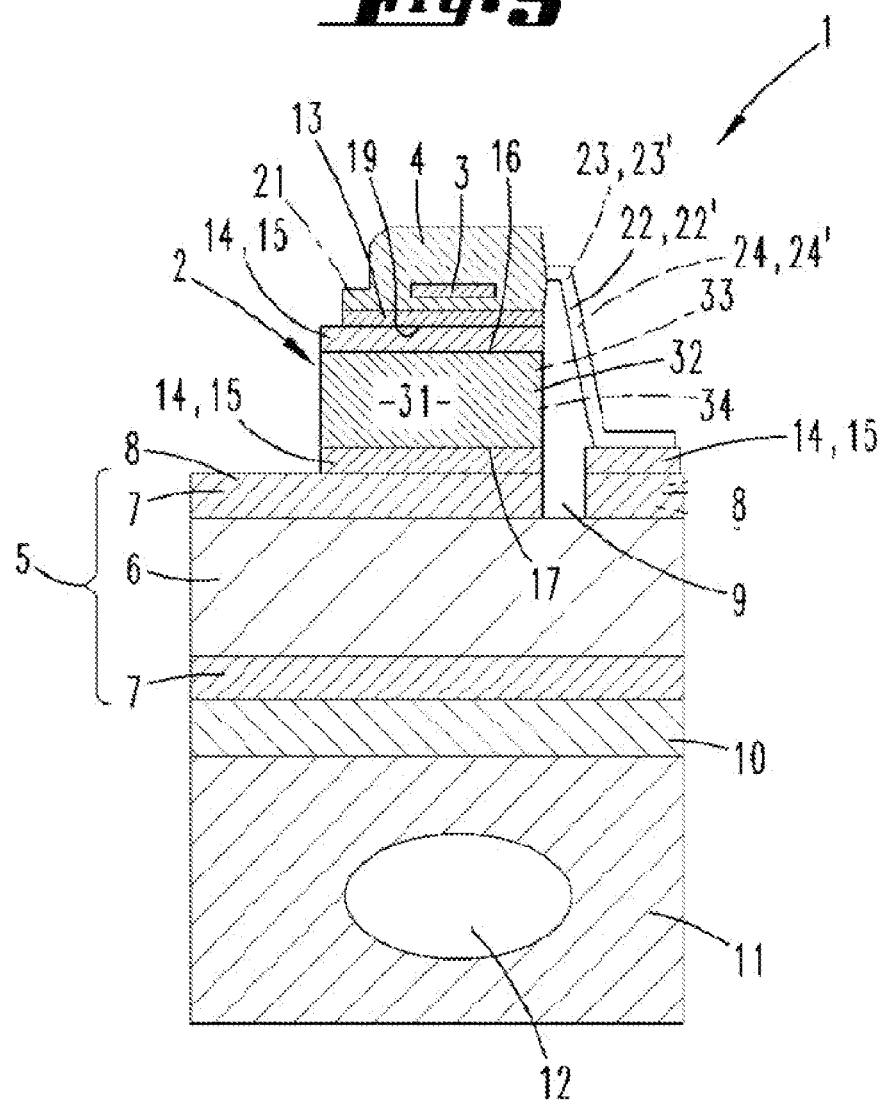

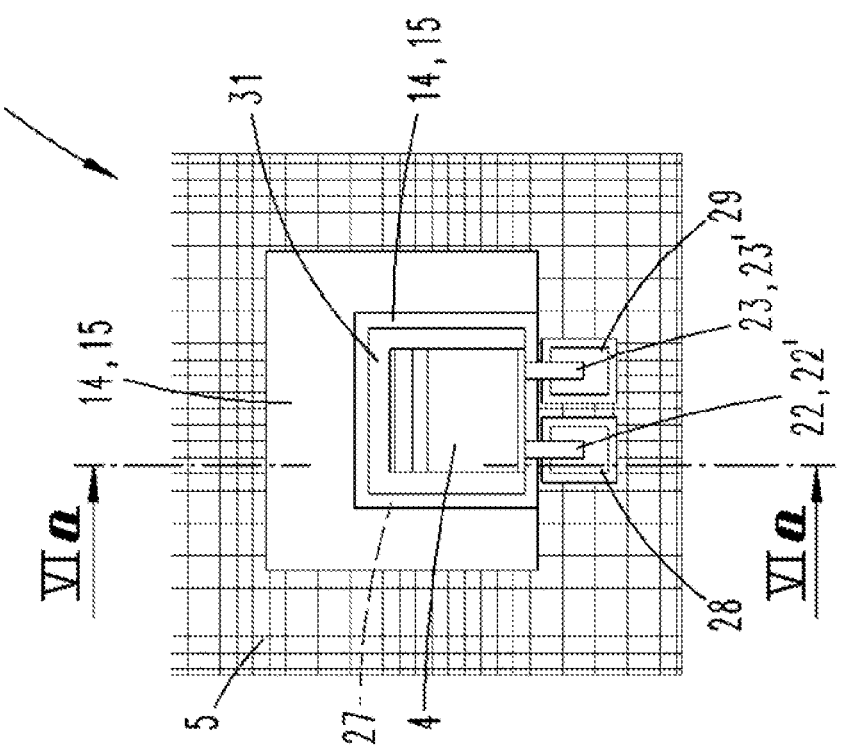
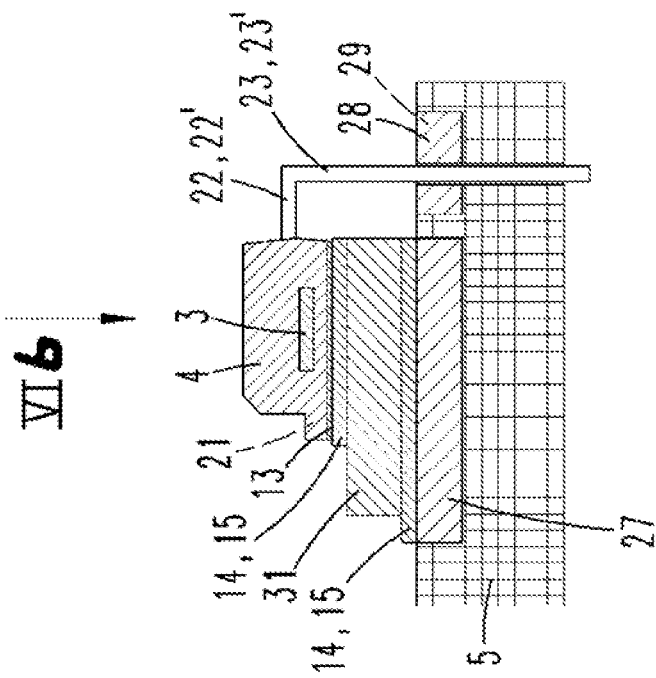

SEMICONDUCTOR COMPONENT ARRANGEMENT, METHOD FOR FABRICATION THEREOF AND HEAT DISSIPATION DEVICE

CROSS REFERENCE TO RELATED APPLICATIONS

This application is the U.S. National Phase Application of PCT International Application No. PCT/EP2019/077255, filed Oct. 8, 2019, which claims priority to German Patent Application No. 10 2018 217 607.8, filed Oct. 15, 2018, the contents of such applications being incorporated by reference herein.

FIELD OF THE INVENTION

The present disclosure relates to a semiconductor component arrangement, a method for fabricating it, and a heat dissipation device.

BACKGROUND OF THE INVENTION

Semiconductor components, especially power semiconductor components, such as power metal oxide semiconductor field-effect transistors (so-called power MOSFETs), are often supplied as components in housings with cooling surfaces (so-called "heatslug", "exposed pad"). Different housing designs exist, for example, designs known under the names TO220, D2PAK or DPAK.

Often, the power semiconductor components accommodated in a housing are intended for surface mounting and are also referred to as surface-mount components or devices (SMD). During operation, power semiconductor components heat up, so that the generated heat must be dissipated. In surface mounting (so-called SMD mounting) of a power semiconductor component on a printed circuit board, this generally acts as a heat sink. The aforementioned heatslug, which is usually located on a metal plate of the power semiconductor component, is assigned a metal mounting surface (so-called footprint) on the printed circuit board for SMD mounting, wherein the area of the footprint on the printed circuit board corresponds roughly to the heatslug area of the semiconductor component.

In general, the heat is passed from the printed circuit board to a device housing via thermal through-holes, i.e. via metalized through-holes (also called thermal vias) and via thermally conducting paste (thermal interface material). Thermal vias can be placed under the heatslug or, for example, in its direct vicinity in the printed circuit board. As thermal vias usually extend perpendicular to the plane of the printed circuit board, the heat can be dissipated over a short distance, e.g. to a device housing.

Such semiconductor components, which are installed in a component housing, are also used, for example, in charging devices for electromobility. Here, very high power losses occur during operation, so that cooling is of particular importance.

Since high voltages are generated (for example for an 800 V battery), high demands are also placed on the insulation. The requirements regarding insulation and overvoltage protection are defined in various standards, for example in the IEC60664-1 standard (sometimes also referred to as "Insuco standard"; Insuco="Insulation Coordination").

In some applications, the use of thermal vias is not permitted due to electrical insulation regulations. On the other hand, with standard printed circuit boards (PCBs), only a small copper layer thickness (often only 70 microns, sometimes up to 105 or 200 microns, but rarely more) is available per layer level. As a result, the power loss that the power component emits via its heatslug can no longer be adequately dissipated using standard circuit board technology and using the standard footprint design.

In order to satisfy strict requirements with regard to electrical insulation and heat dissipation, it is known that starting from the semiconductor component, an electrical insulation is applied first, followed by a so-called heat spread by means of an Al/Cu plate and then the further heat dissipation. In this respect, the so-called thermal clad isolated metal substrate (protected designation IMS) from the Bergquist-Henkel company is known. Other techniques exist that allow good heat dissipation, but on the other hand they do not provide sufficient electrical insulation and sometimes have other disadvantages, such as tolerances, that make soldering more difficult.

Overall, in particular with regard to the standards mentioned, they suffer from the problem that standard circuit boards do not allow the required electrical insulation and the necessary cooling (i.e. heat dissipation) to be achieved simultaneously. This leads to conflicting objectives in the insulation coordination.

SUMMARY OF THE INVENTION

Against this background, an aspect of the present disclosure is an advantageous further development of a semiconductor component arrangement and/or a method for fabricating a semiconductor component arrangement and/or a heat dissipation device for a semiconductor component arrangement. In particular, the aim is to be able to overcome at least individual disadvantages or all of the disadvantages specified above. In particular, it is also intended to create a means of thermal buffering in order to cushion short-term power peaks associated with a rise in temperature.

According to a first aspect, a semiconductor component arrangement having at least one semiconductor component and a printed circuit board is specified.

According to a further aspect, a method for fabricating the semiconductor component arrangement is specified.

According to a third aspect of the present disclosure, an electrical circuit is specified which comprises the semiconductor component arrangement.

According to a fourth aspect, a heat dissipation device for a semiconductor component arrangement is specified.

The semiconductor component arrangement has an—in particular first—metal block arranged between the semiconductor component and the printed circuit board, which is connected to an—in particular first—electrical connector of the semiconductor component by means of a solder joint and which is connected to at least one conductor track of the printed circuit board by means of a further solder joint. In particular, the metal block is soldered to an exposed mounting surface of the conductor track. "Exposed" means in particular that the mounting surface—in particular for producing the further solder joint—is not covered by solder resist. After the further solder joint has been produced, the mounting surface is covered, in particular locally or completely, with soldering tin and covered by the first metal block. In an extension, the conductor track is formed completely or locally by an etched copper layer, which is applied in particular to an insulating carrier of the printed circuit board.

In an advantageous design, the metal block has an extension in the direction away from the printed circuit board and towards the semiconductor component that is at least as large as the extension of the semiconductor component in this direction, measured from the first electrical connector towards the printed circuit board. If the semiconductor component is arranged in a housing, the extension of the semiconductor component is understood to mean its extension inclusive of the housing.

An advantageous result of such an integration of the metal block is that, when viewed from the direction of the semiconductor component that is heated up in operation, the heat spread, i.e. the propagation of the heat flow which promotes the thermal transport, takes place by means of a wider heat conductor compared to a previous heat conductor, applied prior to the electrical insulation, which simultaneously creates a thermal barrier. In particular, a first heat spread can be achieved at the connection between the electrical connector and the metal block. A second heat spread can occur at the connection to the conductor track. In addition, a particularly good lateral propagation of the heat dissipated by the semiconductor component can be achieved within the comparatively thick metal block.

In this way, the thermal conductivity of the connection between the semiconductor component and the printed circuit board can be improved, which improves the heat dissipation. This also enables a standards-compliant insulation, and the conflicting objectives of the insulation coordination are resolved in an advantageous way.

According to an embodiment, the semiconductor component arrangement has a metal body that is incorporated into the printed circuit board. The metal block is connected to the metal body by means of the further solder joint. In particular, the metal body comprises the exposed mounting surface.

In an extension, the metal body forms a section of the conductor track, the rest of which is formed in particular by the etched copper layer. For example, a surface of the conductor track facing away from a base body of the printed circuit board, including a surface of the metal body facing away from the base body of the printed circuit board, is arranged entirely in a single plane. In an extension, the metal body is prefabricated and subsequently attached to the base body of the printed circuit board.

A first heat spread can also be achieved in this case at the connection between the electrical connector and the metal block. A second heat spread can also occur at the connection to a metal body incorporated into the printed circuit board.

By means of the heat spread at the connections between electrical connector and metal block and between metal block and conductor track or metal body, it is thus even possible to achieve an additive heat spread. The additional advantage obtained is that the metal block and the metal body, if present, also has a thermal buffer effect, so that it can also be effective as a heat sink. By increasing the mass of the thermally conductive materials and their spatial extent, the heat spread into the various deeper-lying layers is improved and thus more heat is dissipated more efficiently into a housing or other heat sink. In addition, short-term temperature increases caused by power peaks can be buffered by the increased thermally effective mass in the conduction path.

In one embodiment, the semiconductor component has at least one additional electrical connector—preferably a plurality of additional electrical connectors. The semiconductor component arrangement contains at least one metal block group which comprises the first metal block and at least one further metal block—preferably a plurality of further metal blocks—wherein in particular each additional metal block is assigned to one of the additional electrical connectors. The number of additional metal blocks belonging to the metal block group is preferably equal to the number of additional electrical connectors. The, or each additional, metal block of the metal block group is interposed between the or a respective additional electrical connector of the semiconductor component and the printed circuit board. In particular, each of the additional metal blocks is soldered on one side to one of the further electrical connectors and on another side is soldered to a further conductor track of the printed circuit board.

This allows, for example, each electrical connector to be assigned one metal block each for the electrically and thermally conductive connection to a printed circuit board.

In one embodiment the semiconductor component is installed in a housing, wherein the first electrical connector of the semiconductor component is connected to a first metal plate fixed to the housing. Such metal plates have a surface exposed to the housing and are known as heatslugs. In other words, the semiconductor component has a housing and the first electrical connector is formed by a surface of the first metal plate exposed to the housing. The dimensioning of the exposed surface primarily meets the requirements on heat dissipation; as a rule, the free surface is at least one square millimeter in size.

In an extension, a second electrical connector of the semiconductor component is connected to a second metal plate attached to the housing—i.e. formed in particular by an exposed surface of the second metal plate. In addition, a third electrical connector of the semiconductor component can be connected to a third metal plate attached to the housing—i.e. formed in particular by an exposed surface of the third metal plate—and in particular a fourth electrical connector of the semiconductor component can be connected to a fourth metal plate attached to the housing, i.e. formed in particular by an exposed surface of the fourth metal plate.

However, in an alternative, preferred, extension, the second electrical connector and any further electrical connectors of the semiconductor component protrude out of the housing as a pin of the respective connector.

In one embodiment, the first metal block has a first end face and a second end face facing in the opposite direction and is connected on its first end face to a plate surface—which in particular is the exposed surface—of the first metal plate by means of the solder joint and on its second end face is connected to the conductor track of the printed circuit board by means of the further solder joint. Accordingly, each of the further metal blocks—in particular the second, third or fourth metal block—can have a first end face and a second end face facing in the opposite direction, and can be connected on its first end face by means of the respective further solder joint to a respective further electrical connector—i.e. in particular to the second or third or fourth electrical connector—of the semiconductor component and connected on its second end face to a respective further conductor track of the printed circuit board by means of a solder joint. Such embodiments are particularly well suited to surface mounting.

The solder joint on the first end face and/or the solder joint on the second end face of the respective metal block can preferably be implemented by means of reflow soldering. It is preferred that the conductor track, which is connected to a metal block by means of a solder joint, is part of an outer layer of the printed circuit board, or that each conductor track that is connected to a metal block by means of a solder joint is part of an outer layer of the printed circuit board.

In one embodiment, all the first end faces of the metal blocks of the metal block group—in particular the first metal block and the further metal block or the further metal blocks, e.g. the second metal block or the second and third metal block or the second, third and fourth metal blocks—extend in a first plane and all second end faces of the metal blocks of the metal block group extend in a second plane, wherein the first plane and the second plane are in particular parallel to each other.

In one embodiment, the metal blocks of the metal block group are arranged laterally next to one another. Laterally next to one another means next to one another with respect to an arbitrarily oriented reference plane, wherein the term next to one another does not mean a fixed arrangement in a row, but that different arrangements are possible as required. Preferably, in plan view the metal blocks are arranged offset with respect to each other on a main extension plane of the printed circuit board.

In an extension, the metal blocks of the metal block group are partially or completely covered on their lateral outer sides by an electrically insulating casing that is common to them. The casing is in particular made of plastic; in other words, the casing is a plastic body with which the metal blocks are encapsulated, for example. In particular, the metal block group is prefabricated. In other words, the metal blocks of the metal block group are fixed in position relative to each other by the casing, wherein the stationary fixing is preferably carried out before the encased metal block group is connected—in particular before it is soldered—to the printed circuit board. In this way, the printed circuit board can be particularly easily fitted with the encased metal block group and the component. A particularly simple and/or precise alignment of the metal blocks relative to each other and to the conductor tracks of the printed circuit board or the electrical connectors of the component can thus be achieved.

A simple and thus inexpensive shaping can be achieved by the fact that the metal block or any given metal block has a uniform cross-section assigned to it in any plane parallel to the first plane and/or to the second plane. This means that when considering a single metal block it will have a uniform cross-section, but when considering multiple metal blocks they can have identical or different cross-sections in comparison to each other in the given planes. For example, the metal blocks are cuboidal and have parallel sides, in particular with respect to the first and second planes. With regard to a convenient surface mount assembly and/or advantageous heat spread, in an extension the cross-section of the first metal block can be larger, at least several times larger, than the cross-section of the other metal block or the cross-section of any other metal block.

In one embodiment, the first end face of the first metal block is larger than the plate surface of the first metal plate. In particular, the solder joint extends between the first metal plate and the first metal block throughout the region in which the plate surface overlaps the first end face (16) of the first metal block. In this way, a particularly good heat spread can be achieved. For example, the first metal block protrudes laterally beyond the first metal plate. An edge length of the metal block is preferably at least 30% larger in the direction in which it protrudes laterally beyond the metal plate than the edge length of the metal plate in the same direction.

In a convenient design, each solder joint comprises a soldering tin layer. In a further embodiment, the respective first end face and the respective second end face on the metal block or on the metal blocks have a passivation suitable for a soldering process.

In one embodiment, the first metal block has a first end face and a second end face facing in the opposite direction, is connected on its first end face to a plate surface of the first metal plate by means of the solder joint and on its second end face is connected to the metal body incorporated into the printed circuit board by means of the further solder joint. In an extension, the second metal block has a first end face and a second end face facing in the opposite direction, is connected on its first end face to the second electrical connector of the semiconductor component by means of a solder joint and on its second end face is connected to the second metal body incorporated into the printed circuit board. In addition, the third metal block can have a first end face and a second end face facing in the opposite direction, be connected on its first end face to a third electrical connector of the semiconductor component by means of a solder joint and connected on its second face to a third metal body incorporated into the printed circuit board, wherein in particular it is provided that a fourth metal block has a first end face and a second end face facing in the opposite direction, and is connected on its first end face to a fourth electrical connector of the semiconductor component by means of a solder joint and connected on its second end face to a fourth metal body incorporated into the circuit board.

In an embodiment, the exposed mounting surface of the conductor track to which the first metal block is soldered, or the first metal body incorporated into the printed circuit board has a larger surface extension compared to the first metal block with respect to the main extension plane of the printed circuit board. For example, the surface of the metal body or the mounting surface is at least 30% larger than the surface of the first metal block in plan view of the main extension plane of the printed circuit board. This enables even further heat spread and a particularly high overall heat spread.

According to an embodiment, a pin of a second electrical connector and in particular a pin of a third electrical connector and in particular a pin of a fourth electrical connector of the semiconductor component are soldered onto respective further conductor tracks of the printed circuit board and/or onto further metal bodies incorporated into the printed circuit board, or alternatively soldered by means of a through-hole mounting to respective further conductor tracks of the printed circuit board and/or to metal bodies incorporated into the printed circuit board. In this embodiment, for example, the arrangement can comprise only the first metal block—and no metal block group with further metal blocks.

For soldering onto conductor tracks, the pins can preferably be embodied as so-called SMD pins (SMD=surface-mount device). Due to the first metal block, it should be ensured that the SMD pins are provided with sufficient solder volume to bridge the resulting height difference. According to a simple and inexpensive embodiment, a soldering tin layer is provided in the region of the solder joint in relation to a respective metal block on its respective first end face and on its respective second end face and/or that a soldering tin layer is provided between a respective pin and a conductor track (8) soldered to the pin in the region of the solder joint.

In one embodiment, the metal block is made of copper and/or the at least one further metal block is made of copper. Copper has both good electrical conductivity and good thermal conductivity, and also has a heat storage capacity suitable for an aspect of the invention. Other alloys, in one design containing copper, are also conceivable for the metal block and/or the at least one further metal block. With regard to the also desirable property of heat storage, it is preferred that the metal block or that a respective metal block has a thickness perpendicular to its first end face which corresponds to a multiple of the thickness of the conductor tracks of the printed circuit board.

In a further embodiment, the metal body incorporated into the printed circuit board and/or each further metal body incorporated into the printed circuit board, in particular the second and/or third and/or fourth metal body, has a thickness in a direction perpendicular to the main extension plane of the printed circuit board which is at least a multiple of the thickness of the conductor track or the respective further conductor track in a region adjacent to the respective metal body. In a further embodiment, the metal body and/or the further metal body(bodies) is/are made of copper. In this respect, in addition to the metal block or the metal blocks, the or any of the metal bodies incorporated into the printed circuit board can act as additional heat sink(s) and provide thermal buffers to cushion short-term power peaks of the semiconductor component due to temperature rise.

An aspect of the invention is particularly advantageous when, as in some preferred embodiments, the semiconductor component is a power semiconductor component, in particular a power metal oxide semiconductor field-effect transistor (power MOSFET). In particular, it can be a semiconductor component that generates a power loss of 2 watts or more when operating as intended and/or that heats up by at least 10 degrees Celsius after switching on when operating as intended. In particular, it can be a semiconductor component that is designed for operation at 24 V with a current strength of at least 1 Ampere or at 48 V with a current strength of, for example, 0.5 ampere.

With regard to the printed circuit board, a standard printed circuit board is preferred. According to one embodiment, the circuit board is a printed circuit. In an extension, the printed circuit board has two outer copper layers and between them three prepregs with a thickness of at least 0.4 millimeters, or the printed circuit board has four copper layers and between each two adjacent copper layers at least one prepreg, in an advantageous design three prepregs, in particular having a thickness of at least 0.4 millimeters. The expression "three prepregs with a thickness of at least 0.4 millimeters" refers in particular to the fact that the three prepregs together have a total thickness of at least 0.4 millimeters. "Prepregs" means, in particular, boards that have glass-fiber reinforced (epoxy) resin, for example the material known by the name FR-4. In particular, prepregs are textile fiber-matrix semi-finished products pre-impregnated with reaction resins, which are cured during the fabrication of the printed circuit board, preferably under the application of temperature and/or pressure, and are therefore cured in the finished printed circuit board. Such circuit boards are available as standard printed circuit boards.

In one embodiment, on its side facing away from the semiconductor component the printed circuit board is connected in a thermally conductive manner to a heat sink, in particular by means of a thermal interface, wherein it is provided in particular that the heat sink is connected to a coolant circuit. In this way, a particularly efficient dissipation of the heat generated by the semiconductor component during operation can be achieved.

By means of individual features or a plurality of the described features, the total thermal resistance between a heat-generating power semiconductor component and the heat sink can be significantly reduced compared to conventional techniques by using standard printed circuit boards. The printed circuit board, also referred to as a substrate, which provides a basic electrical insulation required by the standards, which at the same time acts as a thermal barrier and which is located in the heat flow between the semiconductor component and the heat sink, is permeated by heat in a large cross-section due to single or multiple heat spreading, so that a high heat flow can still flow. As an alternative or in addition to a liquid-cooled device, a device housing can also be considered for use as a heat sink. There is a wide range of design freedom with regard to the metal block or the metal blocks. The arrangement is particularly advantageous in all types of electronic assemblies which have a high power loss and which meet the requirements of the insulation coordination standards, wherein these requirements can advantageously be satisfied according to the present disclosure with a standard printed circuit board.

In one embodiment, the electrical circuit is a circuit of a charging device (in particular a so-called on-board charger), a (power) output stage, an engine control unit or a circuit of another device for the electrification of motor vehicles. In all applications, the semiconductor component arrangement enables effective heat dissipation of power semiconductor components that generate waste heat.

In a first step of a method for fabricating a semiconductor component arrangement, the printed circuit board, the semiconductor component that has at least one first electrical connector, and at least one metal block are provided. In an advantageous extension, the prefabricated, encased metal block group with the first and the at least one further metal block and the casing is provided.

In a further method step, the first electrical contact is connected to a first end face of the first metal block by means of a solder joint and, in particular immediately afterwards, a second end face of the first metal block, located on the opposite side of the first metal block to the first end face, is connected to a conductor track of the printed circuit board by means of a solder joint or, if a first metal body is incorporated into the printed circuit board, by means of the metal body integrated into the printed circuit board. If a prefabricated, encased metal block group is provided, in particular in a further method step—preferably at the same time as the solder joint is formed between the conductor track or the metal body and the second end face of the first metal block and/or at the same time as the solder joint is formed between the first electrical contact and the first end face of the first metal block—the further metal block (32, 33, 34) of the prefabricated, encased metal block group is interposed between the further electrical connector (22, 23, 24) and the printed circuit board (5) by means of a solder joint (14).

In terms of possible extensions, advantages and effects, reference is made to the rest of the description. In one embodiment, the first electrical connector is connected to a metal plate (so-called heatslug) of a component housing of the semiconductor component and/or the metal plate is applied to the metal block used as a heat sink and for heat spreading by means of surface mounting technology (SMT)—in particular by means of reflow soldering. In an extension, the heat sink is then fixed to the printed circuit board by means of another SMT process—in particular by means of reflow soldering—preferably on a conductor track or on a metal body incorporated into the printed circuit board.

In one embodiment, the heat dissipation device comprises a plurality of metal blocks arranged laterally next to one another and covered on their lateral outer surfaces by an electrically insulating casing common to them. The metal blocks are preferably manufactured from copper. The casing is fabricated in particular of plastic; in particular, the metal blocks are encapsulated with the plastic casing. The heat dissipation device with the encased metal blocks is preferably designed for soldering to a printed circuit board. In particular, the heat dissipation device is formed by the prefabricated metal block group.

In one embodiment, each metal block has a first end face extending across its outer surface and a second end face extending across its outer surface, wherein a soldering tin layer is applied to each first end face and to each second end face. In terms of possible refinements, effects and advantages, reference is made to the rest of the description—in particular where it relates to the metal block group.

BRIEF DESCRIPTION OF THE DRAWINGS

In the following, preferred exemplary embodiments of the present invention are described with reference to the attached figures. In the drawings:

FIG. 1 shows a schematic side view of a heat dissipation device according to the invention in accordance with a preferred exemplary embodiment;

FIG. 2 shows a front view of the heat dissipation device shown in FIG. 1 in the viewing direction II shown there;

FIG. 3 shows a front view of a heat dissipation device according to the invention in accordance with a second preferred exemplary embodiment;

FIG. 4 shows a sectional view of a semiconductor component arrangement according to the invention in accordance with a first preferred exemplary embodiment;

FIG. 5 shows a sectional view of a semiconductor component arrangement according to the invention in accordance with a second preferred exemplary embodiment;

FIG. 6A shows a sectional view of a semiconductor component arrangement according to the invention in accordance with a third preferred exemplary embodiment and FIG. 6B shows a plan view of the semiconductor component arrangement shown in FIG. 6A in the viewing direction VIb shown there.

DETAILED DESCRIPTION OF THE PREFERRED EMBODIMENTS

The semiconductor component arrangement 1 shown in FIG. 4 comprises the heat dissipation device 2 shown in FIGS. 1 and 2, so that the description is coherent. The semiconductor component arrangement 1 comprises a semiconductor component 3, which is installed in a housing 4 and which is therefore not shown in greater detail in the figures. The example used is a so-called power MOSFET, i.e. a power metal oxide semiconductor field-effect transistor. The semiconductor component 3 is connected by means of the heat dissipation device 2 to a printed circuit board 5, which in the example has three so-called prepregs, combined in the illustration to an electrically and thermally insulating intermediate layer 6, as well as two outer copper layers 7. FIG. 4 shows schematically that the upper copper layer 7 comprises a plurality of conductor tracks 8 made of copper, which for simplicity uniformly carry the same reference sign. In conjunction with FIGS. 1 and 2, it will be clear that the copper layer 7 in the present exemplary embodiment comprises at least four conductor tracks 8, of which one conductor track is located on the left-hand side in FIG. 4 of the gap 9, which extends in the shape of a strip perpendicular to the drawing plane, and of which the three further conductor tracks 8 are located on the right-hand side of the gap 9 and in turn are separated from each other by means of further strip-shaped gaps, not visible in the sectional plane and running perpendicular to the gap 9. On its side facing away from the semiconductor component 3, the printed circuit board 5 is connected by means of a so-called thermal interface 10 to a heat sink 11, which is permeated by a coolant (for example, water) for heat dissipation by means of a coolant circuit, not shown.

The semiconductor component 3 has a first electrical connector 21 which is covered by the housing 4, a second electrical connector 22, a third electrical connector 23 and a fourth electrical connector 24, wherein the third and fourth connectors 23, 24 in FIG. 4 are hidden from view by the second connector 22.

The heat dissipation device 2 comprises a comparatively large first metal block 31, a comparatively small second metal block 32, also shown in sectional view in FIG. 4, as well as a third metal block 33 and a fourth metal block 34, which are similar in size to the second metal block 32 and are arranged behind the second metal block 32 in the viewing direction of FIG. 4. The four metal blocks 31, 32, 33 and 34 in functional terms form a prefabricated metal block group for connecting the semiconductor component 3 to the printed circuit board 5. For this purpose, the first metal block 31 is arranged between the semiconductor components 3 located in the housing 4 and the printed circuit board 5, and the metal blocks 32, 33 and 34 are arranged in each case between one of the electrical connectors 22, 23 and 24 and the printed circuit board 5.

In the example, the first electrical connector 21 is metallically connected to a first metal plate 13 (so-called heatslug) fixed to the housing 4. The metal plate 13 and thus the first electrical connector 21 is connected in an electrically conductive manner to the first metal block 31 by means of a solder joint 14, which has the soldering tin layer 15 shown in cross-section in FIG. 4. FIG. 1 shows that the soldering tin layer 15 is applied to a first end face 16 of the first metal block 31. The first end face 16 of the first metal block 31 is located in a common first plane 18 together with a first end face 16 of the second metal block 32, with a first end face 16 of the third metal block 33 and with a first end face 16 of the fourth metal block 34. Correspondingly, on the opposite side, a second end face 17 of the first metal block 31 is located in a second plane 20 together with a second end face 17 of the second metal block 32, with a second end face 17 of the third metal block 33 and with a second end face 17 of the fourth metal block 34. In this example, a soldering tin layer 15 is applied to every first end face 16 and to every second end face 17. The first metal block 31 is electrically conductively connected by means of the soldering tin layer 15 applied to its second end face 17 to the conductor track 8 of the printed circuit board 5, located underneath it in FIG. 4. As will be clear from the figures, for clarity all soldering tin layers are uniformly labeled with 15 and all solder joints each formed from a soldering tin layer 15 are uniformly labeled with the reference sign 14 for clarity. The sectional view in FIG. 4 shows a plate surface 19 of the first metal plate 13 which has been connected to the soldering tin layer 15.

As can be seen from FIGS. 1 and 2 in particular, the metal blocks 31, 32, 33, 34 are arranged laterally next to one another. FIG. 2 shows their distributed arrangement side by side relative to the drawing plane. In the example, the three metal blocks 32, 33, 34 have identical dimensions to each other and are arranged in a row with respective intermediate distances relative to a transverse direction Q of the heat dissipation device 2. The metal block 31, larger in comparison, is spaced apart from them in a longitudinal direction L perpendicular to the transverse direction Q. FIG. 1 shows that the lateral outer surfaces 25 of the metal blocks 31-34 are encased almost to their entire height by an electrically insulating casing 26 made of plastic. The metal blocks 31-34 together with the casing, which fixes the metal blocks 31, 34 at fixed positions relative to each other, form the prefabricated metal block group. When the printed circuit board 5 is being fitted with components to produce the semiconductor component arrangement 1, the metal block group with the encased metal blocks 31-34 is mounted as one component on the printed circuit board and subsequently soldered to the conductor tracks 8 and/or the electrical connectors 21-24.

In cross-sectional planes perpendicular to the end face 16, 17, the cross-section of the first metal block 31 is larger than the cross-section of each of the other metal blocks 32-34. FIG. 4 shows that the first end face 16 of the first metal block 31 and the surface area of the soldering tin layer 15 formed thereon are larger than the adjacent plate surface 19 of the metal plate 13, which is attached to the housing 4 as a so-called heatslug.

It is also clear from FIG. 4 that a pin 22 of the second electrical connector 22, which is bent at its free end parallel to the soldering tin layer 15 applied to the second metal block 32, is soldered by means of the soldering tin layer 15 on the end face 16 of the second metal block 32 facing the soldering tin layer. In its opposite end face 17, the metal block 32 is soldered by means of the soldering tin layer 15 applied there onto the conductor track 8 also shown in FIG. 4, which runs to the right of the gap 9.

In the exemplary embodiment, it is provided that all metal blocks 31, 32, 33, 34 are made of copper.

The embodiment with second, third and fourth electrical connectors 22, 23, 24 in addition to the first electrical connector 21 is selected as an example only. For example, if the semiconductor component 3 is a MOSFET, it usually has only the first 21, in addition to two further electrical connectors 22, 23. Accordingly, in addition to the first metal block 31 the heat dissipation device in this case advantageously has only two further metal blocks 32, 33. Embodiments with a larger number of further electrical connectors and further metal blocks—e.g. five—are also possible.

FIG. 3 shows a second preferred exemplary embodiment of a heat dissipation device 2 according to the invention. For the connection of two semiconductor components 3 to a printed circuit board 5 two metal block groups, each one of which comprises the four metal blocks 31-34 shown in FIGS. 1 and 2, are encased by a common insulating casing 26.

The second preferred exemplary embodiment of a semiconductor component arrangement 1 according to the invention, shown in FIG. 5, differs from the embodiment of FIG. 4 in that only the first metal block 31 is present. The metal blocks 32-34 and the casing 26 are not present. The metal block 31 is soldered in place by means of the two solder joints 14, each formed by a soldering tin layer 15 between the metal plate 13 (heatslug) of the housing 4 and a conductor track 8 and thus interposed in the thermal path between the semiconductor component 3 and the printed circuit board 5. A pin 22' of the second electrical connector 22 of the semiconductor component 3 has been extended compared to the embodiment of FIG. 4 and is soldered at its free, again angled longitudinal end by means of a solder joint 14 formed by a soldering tin layer 15 onto a conductor track 8, which is electrically isolated by means of the gap 9 from the conductor track 8 electrically connected to the first electrical connector 21. As in FIG. 4, a pin 23' of a third electrical connector 23 and a pin 24' of a fourth electrical connector 24 of the semiconductor component are hidden by the pin 22', however, like the pin 22', they are soldered onto further conductor tracks 8 in the same manner.

FIGS. 6A and 6B show a third preferred exemplary embodiment of a semiconductor component arrangement 1 according to the invention, wherein again, comparable details or those corresponding to the preceding embodiments are marked with the same reference signs. A first metal body 27, a second metal body 28 at a distance laterally from the first, and a third metal body 29 spaced a distance behind it in the direction of view of FIG. 6A are all incorporated into the printed circuit board 5, so that the respective exposed metal surface in the example terminates flush with a top side of the printed circuit board 5. A first metal block 31, which, like the metal bodies 27-30, consists of copper, is soldered onto the first metal body 27 in surface contact by means of a solder joint 14 formed from a soldering tin layer 15. Another semiconductor component 3, which is a power semiconductor component mounted in a housing 4, is soldered onto the opposite surface of the metal body 31 by means of a further solder joint 14 formed by a soldering tin layer 15. In the process a first electrical contact 22 of the semiconductor component 3 is again connected to the metal plate 13 which is adjacent to the soldering tin layer 15.

As shown, the thermal conductivity cross-section of the first metal plate 31 is larger than that of the metal plate 13 (heatslug), and the thermal conductivity cross-section of the first metal body 27 is larger than the thermal conductivity cross-section of the first metal block 31. Thus, a multiple, i.e. additive heat spreading is achieved.

The first metal body 27 may have been formed in the allocated cavity of the printed circuit board 5, for example, using masks, by electroplating from a plurality of copper layers applied over one another.

In the example, the semiconductor component 3 also has a second electrical connector 2 and a third electrical connector 23, from each of which pins 22', 23' lead out of the housing 4. The pins 22' and 23' are bent at an angle. The pin 22' on the angled section passes through a plated through hole inserted into the second metal body 28, to the hole wall of which the pin 22' has been soldered. The pin 23' is passed through a plated through hole in the third metal body 29 in a similar manner and electrically conductively soldered to the wall thereof. In a viewing plane perpendicular to the printed circuit board 5, the thickness of the metal bodies 27-29 is thus considerably greater than the thickness of the conductor tracks 8. The first metal body 27 and/or the second metal body 28 and/or the third metal body 29 can be electrically connected to a respective conductor track 8 of the printed circuit board 5 (not included in FIG. 6).

The invention is not restricted to the exemplary embodiments by the description on the basis thereof. Instead, the invention comprises each new feature and each combination of features, which includes, in particular, each combination of features in the exemplary embodiments and patent claims.

The invention claimed is:

1. A semiconductor component arrangement, at least comprising a semiconductor component having a first electrical connector and at least one further electrical connector, and a printed circuit board, wherein the semiconductor component arrangement contains a prefabricated metal block group, wherein the metal block group comprises a first metal block is arranged between the semiconductor component and the printed circuit board, that is connected to the first electrical connector of the semiconductor component by a solder joint and is connected to at least one conductor track of the printed circuit board by a further solder joint, wherein the metal block group comprises at least one further metal block is interposed by a solder joint between the further electrical connector and the printed circuit board, and wherein the metal blocks of the prefabricated metal block group are arranged laterally next to one another and have their lateral outer surfaces partially or completely encased by an electrically insulating casing that is common to the metal blocks, wherein the semiconductor component is installed in a housing, and wherein the first electrical connector of the semiconductor component is connected to a first metal plate fixed to the housing.

2. The semiconductor component arrangement according to claim 1, wherein a section of the conductor track is formed by a metal body that is incorporated into the printed circuit board, the first metal block is arranged between the semiconductor component and the metal body and the first metal block is connected to the metal body incorporated into the printed circuit board by the further solder joint.

3. The semiconductor component arrangement according to claim 1, wherein the first metal block has a first end face and a second end face facing in the opposite direction, is connected on its first end face to a plate surface of the first metal plate by the solder joint and connected on its second end face to the conductor track of the printed circuit board by the further solder joint.

4. The semiconductor component arrangement according to claim 1, wherein the one further metal block or each of the further metal blocks has a first end face and a second end face facing in the opposite direction, is connected on its first end face to the further electrical connector or to one of the further electrical connectors of the semiconductor component by a solder joint and is connected on its second end face to a further conductor track of the printed circuit board by a further solder joint and all the first end faces of the metal blocks of the metal block group extend in a first plane and all the second end faces of the metal blocks of the metal block group extend in a second plane, wherein the first plane and the second plane are parallel to each other.

5. The semiconductor component arrangement according to claim 4, wherein the first end face of the first metal block is larger than the plate surface of the first metal plate, and the solder joint extends between the first metal plate and the first metal block in the entire region in which the plate surface overlaps the first end face of the first metal block.

6. The semiconductor component arrangement according to claim 2 wherein the metal body incorporated into the printed circuit board has a larger surface area compared to the first metal block in relation to a main extension plane of the printed circuit board.

7. The semiconductor component arrangement according to claim 1, wherein at least one of the metal blocks has a thickness perpendicular to its first end face which corresponds to a multiple of the thickness of the conductor tracks of the printed circuit board.

8. The semiconductor component arrangement according to claim 2 wherein the metal body incorporated into the printed circuit board has a thickness in a direction perpendicular to the main extension plane of the printed circuit board that corresponds to at least a multiple of the thickness of the conductor track in an area adjacent to the metal body.

9. The semiconductor component arrangement according to claim 1, wherein on its side facing away from the semiconductor component the printed circuit board is connected in a thermally conductive manner to a heat sink by a thermal interface, wherein the heat sink is connected to a coolant circuit.

10. A method for producing a semiconductor component arrangement according to claim 1, comprising:

supplying of the printed circuit board, the semiconductor component and the prefabricated, encased metal block group, connecting the first electrical contact to a first end face of the first metal block of the prefabricated, encased metal block group by a solder joint and, subsequently, connecting a second end face of the first metal block of the prefabricated, encased metal block group, which is located on the side of the first metal block opposite to the first end face, to a conductor track of the printed circuit board by a solder joint, or, if a first metal body is incorporated into the printed circuit board, by the metal body integrated into the printed circuit board and interposing the further metal block of the prefabricated, encased metal block group between the further electrical connector and the printed circuit board by a solder joint.

11. The semiconductor component arrangement according to claim 1, wherein the electrically insulating casing is made of plastic.

12. A semiconductor component arrangement at least comprising, a semiconductor component having a first electrical connector and at least one further electrical connector, and a printed circuit board, wherein the semiconductor component arrangement contains a prefabricated metal block group, wherein the metal block group comprises a first metal block is arranged between the semiconductor component and the printed circuit board, is connected to the first electrical connector of the semiconductor component by a solder joint and is connected to at least one conductor track of the printed circuit board by a further solder joint, wherein the metal block group comprises at least one further metal block is interposed by a solder joint between the further electrical connector and the printed circuit board, and wherein the metal blocks of the prefabricated metal block group are arranged laterally next to one another and have their lateral outer surfaces partially or completely encased by an electrically insulating casing that is common to the metal blocks, wherein a pin of a second electrical connector and a pin of a third electrical connector and a pin of a fourth electrical connector of the semiconductor component are soldered onto conductor tracks of the printed circuit board and/or onto metal bodies incorporated into the printed circuit board or alternatively soldered by a through-hole mounting to conductor tracks of the printed circuit board and/or to metal bodies incorporated into the printed circuit board.

* * * * *